United States Patent

Boudreau et al.

[11] Patent Number: 5,460,318
[45] Date of Patent: Oct. 24, 1995

[54] DIEBONDING GEOMETRY FOR PACKAGING OPTOELECTRONICS

[75] Inventors: Robert A. Boudreau, Hummelstown, Pa.; Richard H. Sargent, Taunton, Mass.

[73] Assignee: GTE Laboratories Incorporated, Waltham, Mass.

[21] Appl. No.: 252,478

[22] Filed: Jun. 1, 1994

[51] Int. Cl.⁶ .................... B23K 101/40; B23K 31/02
[52] U.S. Cl. .............. 228/123.1; 228/215; 228/222; 257/782; 257/783
[58] Field of Search .................. 228/122.1, 215, 228/123.1, 222; 437/902; 257/783, 782

[56] References Cited

U.S. PATENT DOCUMENTS 3,946,334  3/1976  Yonezu et al. ............... 257/783
4,663,652  5/1987  Nishizawa ................... 257/782

OTHER PUBLICATIONS

L. D. Comerford and M. J. Brady, "Capillary Bonded Components for Injection Laser Transmitter Modules," *Electronics Letters*, vol. 18, No. 14 (Jul. 8, 1982) pp. 629–631.

Primary Examiner—P. Austin Bradley
Assistant Examiner—Jeffrey T. Knapp
Attorney, Agent, or Firm—Victor F. Lohmann, III; James J. Cannon, Jr.

[57] ABSTRACT

A solder geometry for epi-down diebonding an optoelectronic component to a heat sink platform includes a solder deposition pattern having exposure windows to create gaps or diebond bridges in the solder pattern. The active regions of the components are disposably registered within the gaps of the solder pattern.

2 Claims, 3 Drawing Sheets

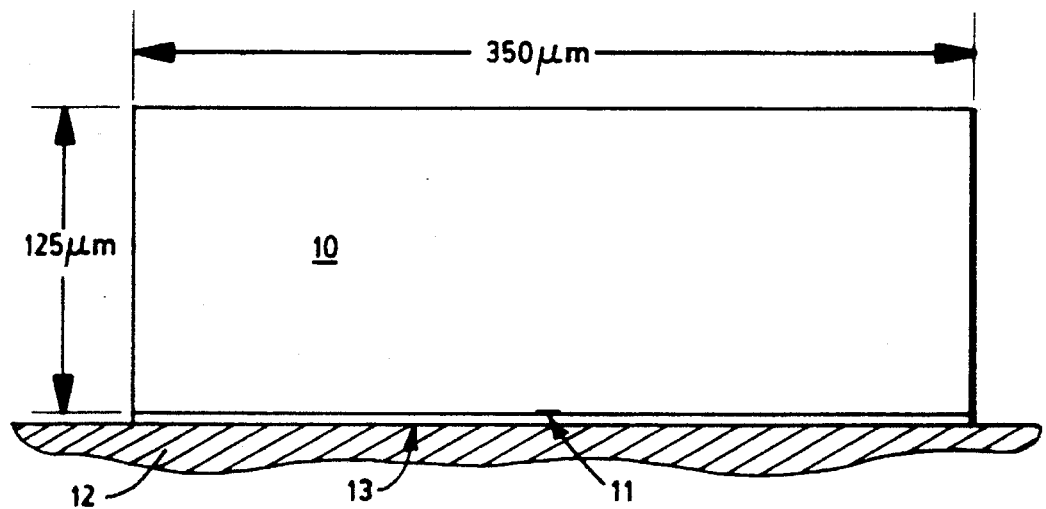
FIG. IA
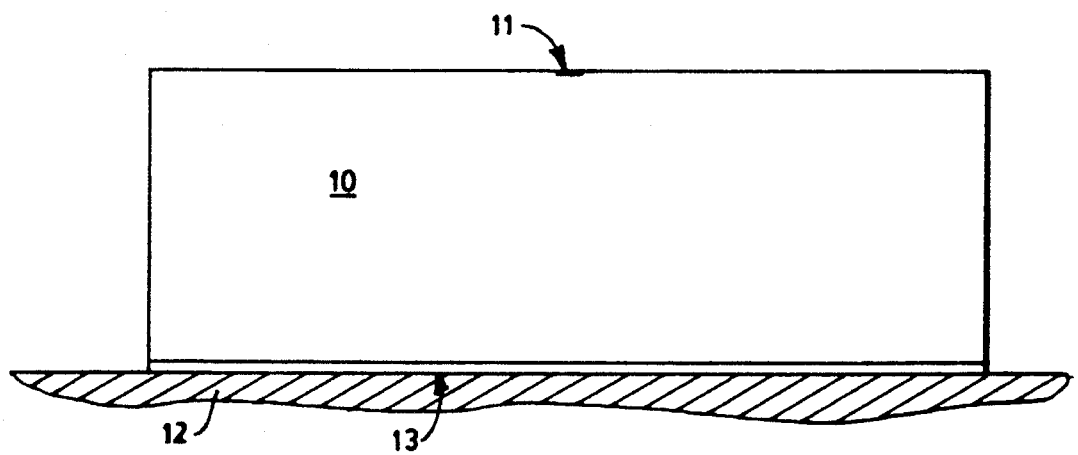
FIG. IB

DIEBONDING GEOMETRY FOR PACKAGING OPTOELECTRONICS

FIELD OF THE INVENTION

The present invention relates to packaging of optoelectronic components and, more particularly, to a diebonding geometry useful as a bond between such components and their heat sinks.

CROSS-REFERENCE TO RELATED APPLICATIONS

This application is related to application Ser. No. 08/252,477 entitled "FLUXLESS DIEBONDING WITH DILUTE ACID VAPOR" of Michael J. Urban and Robert A. Boudreau filed concurrently herewith. The application is hereby incorporated by reference into this application.

BACKGROUND OF THE INVENTION

Optoelectronic devices such as semiconductor lasers, amplifiers, photonic integrated circuits (PICS), and detectors suitable for generating or processing optical and electronic signals are typically grown on wafers of III–V materials such as InP or GaAs. Following growth and fabrication, the wafer is cut into separate devices known as chips or die which are then packaged into an operational configuration. The die need to be subjected to a heat sinking process in order to provide stable optoelectronic properties and high levels of performance. In particular, there is a critical need for providing a non-destructive, clean, stable, thermally conductive bond between optoelectronic devices and their heat sinks. This bond is known as the diebond.

Diebonding employs a heat spreader made of a material with high thermal conductivity such as diamond, cubic boron nitride, or copper. Diebonds for optoelectronics are usually made with solder, although either solder or conductive plastics can be used for electronic diebonds. Diebonding of optoelectronics is difficult since the devices require exceptionally high quality heat sinking to provide functionality, are exceptionally small in size compared to pure electrical devices, must be kept clean to maintain optical performance, and are easily damaged.

Optoelectronic devices relying upon exposed structures such as ridge waveguides to optically guide light, or that are grown on soft, brittle wafers such as InP, are easily damaged during component packaging. For example, exposed structures would be pressed into the solder or contacted by a vacuum pick-up tool during conventional diebonding, depending upon chip orientation. One particularly good solder for diebonding optoelectronics is the eutectic alloy of gold-tin (80/20 ratio). This alloy melts at 280° C. and can be used without flux to provide for an optically clean process.

However, one significant drawback of the gold-tin solder is that it tends to destroy optoelectronic ridge devices diebonded in the epi-down geometry. The probable mechanism responsible for the destruction of the device is that the hard gold-tin solder "crushes" the InP ridge structures during the temperature excursion of diebonding, thus electrically shorting the devices. Destruction does not occur, however, if the devices are bonded epi-up so that the device structure is placed away from the solder. However, epi-down geometry is preferable since it places the source of heat production, namely the device structure, in closest proximity to the heat sink. This particular packaging orientation also permits certain mechanical packaging options that rely upon precise measurements of the distance between the optical region of the device and its bonded surface. This distance is most easily determined for the epi side because the gross thickness of the die need not be considered.

SUMMARY OF THE INVENTION

According to the present invention, a method of integrating a component having active regions with a heat sink platform comprises the steps of patterning a solder deposit on the heat sink platform, wherein the solder deposit includes a window exposing said platform, and epi-down bonding the component to the platform such that the component active regions are disposably registered within the solder window.

BRIEF DESCRIPTION OF THE DRAWINGS

FIGS. 1A and 1B illustrate lateral views of conventional diebonding configurations;

DETAILED DESCRIPTION OF THE PREFERRED EMBODIMENTS

Figure 2:
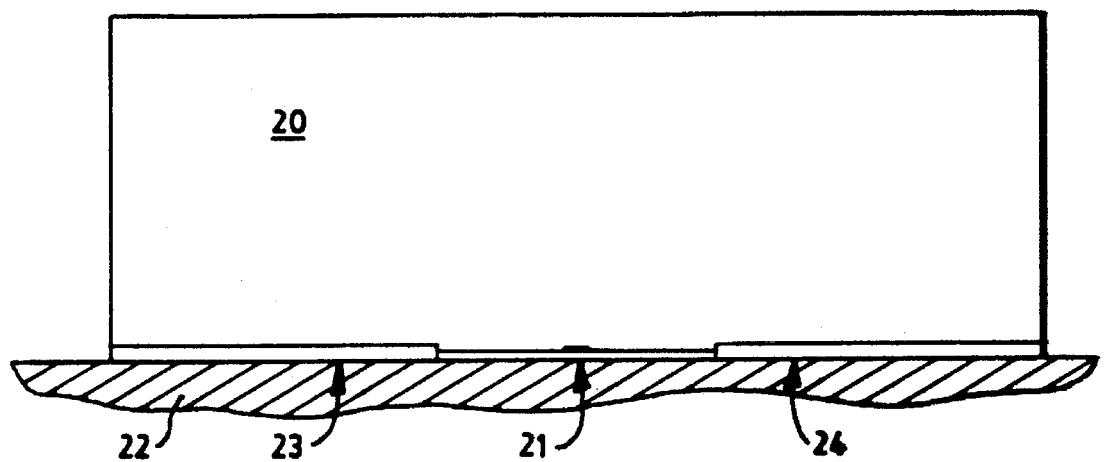
FIG. 2 is a lateral view of a diebonding configuration in accordance with the present invention.

The conventional diebonding approaches are diagrammatically illustrated in the epi-down and epi-up geometries shown respectively in FIGS. 1A and 1B. In the epi-down configuration of FIG. 1A, an optoelectronic component 10 (also known as a chip or die) having a laser structure 11 is disposed on substrate 12. The component 10 is bonded to the underlying substrate 12 with a solder layer 13 which extends over the entire contact area between component 10 and substrate 12. The configuration is characterized as epi-down since the epitaxial layers of component 10 comprising laser structure 11 are oriented in a downward direction towards the substrate 12. Typical dimensions for the chip may be 125 μm×350 μm, and for the laser may be 3 μm×6 μm.

In the epi-up configuration of FIG. 1B, wherein similar components and structures with FIG. 1A are identified by the same reference numerals, component 10 is disposed relative to substrate 12 such that laser structure 11 is oriented in an upward direction away from substrate 12. The key fabrication attribute shared by the epi-down and epi-up configurations is that in each bonding procedure the entire surface region defining the contact area between component 10 and substrate 12 receives a deposition layer of solder material.

In accordance with the present invention, a new diebonding geometry is used which protects sensitive devices from the deposited solder, while preserving the precise mechanical registration of epi-down configurations and the heat-sinking ability of epi-up configurations. The diebonding geometry is characterized as a bridged diebond because the solder deposition process creates a bridge or recess where no solder is applied. In particular, the epi-down bridged diebond involves patterning the solder on the heat sink to create an appropriate gap in the solder pattern where the active device structures will be positioned during diebonding. The active device structures may include, for example, an InP ridge waveguide laser device, wherein the solder composition may include a gold tin alloy.

FIG. 2 is a schematic representation of an optoelectronic packaging configuration employing a solder deposition process in accordance with the present invention. An optoelectronic chip or die assembly 20 including a laser structure 21 is integrated with substrate 22 functioning as a heat sink platform. The integration is performed using a solder deposition procedure defined below.

In a solder deposition process according to the present invention, a solder pattern is developed on an upper surface of substrate 22 such that gaps are defined in the pattern for registration with devices 21. Although a single gap is shown between solder deposit 23 and solder deposit 24, the present invention should not be construed to be so limiting. Rather, the solder deposition process of the present invention may be extended to create any number of gaps in the solder pattern to accommodate multiple device structures in chip 20. For descriptive purposes, the gap may be termed a bridge since the gap functions as a boundary between distinct regions or islands of deposited solder. The width of the gap or bridge is the recommended approximate maximum width that provides heat sinking equivalent to an epi-up geometry. The gap is dependent upon the relative width-to-thickness of the bonded die, wherein a thinner die utilizes a smaller gap.

Figure 3:
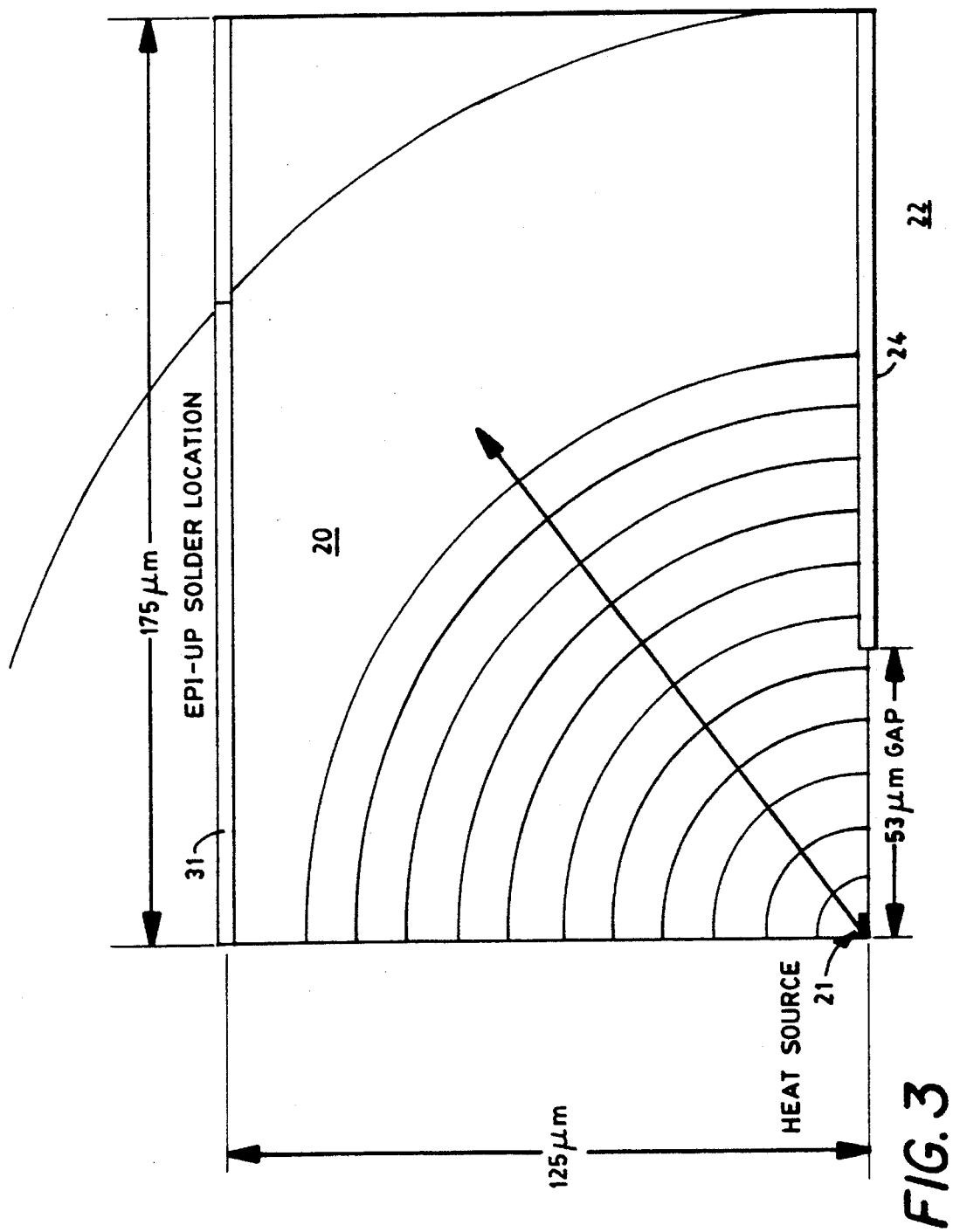
FIG. 3 is a simplified geometrical construct of a portion of the FIG. 2 diebonding configuration illustrating heat-sinking characteristics.

The heat-sinking properties of the FIG. 2 configuration are illustrated in the fragmented view of FIG. 3 corresponding to a half-sectional portion of the diebonding assembly. The construct was developed to illustrate the operation of the bridged diebond and to obtain an estimate of the bridge width, d, that would provide the same amount of heat sinking as an epi-up diebond. The actual bridge width used in a product may vary depending upon the particular application. For example, a bridge width of zero would be better than epi-up, although at some value of bridge width d, the heat sinking is degraded enough to be equivalent to epi-up.

The determination of bridge width, d, is simplified using symmetry relationships. FIG. 3 shows a ridge laser die that typically is 125 μm thick and 350 μm wide, wherein the laser beam direction is orthogonal to the plane of the drawing. Although FIG. 3 depicts the right-hand side of the FIG. 2 configuration, the heat-sinking characteristics discussed below are applicable to the left-hand side due to both sides being symmetrically equivalent. Symmetry also facilitates depiction of the geometry as a half space or 2-dimensional representation since the die has the same structure along the length of the laser. The grey bars represent potential solder locations for bridged epi-down diebonds (24) and conventional epi-up diebonds (31). The solder locations are considered perfect heat sinking boundaries to the chip while the unsoldered locations are considered perfectly insulating boundaries.

The fundamental law of heat conduction may be expressed as:

$$\text{power} = \frac{dQ}{dt} = -kA \frac{dT}{dx} \quad (1)$$

where dQ/dt is thermal power or the rate of heat flow, k is the thermal conductivity of the material, A is the "cross sectional area" of a shell of the material through which the heat is crossing, and dT/dx is the temperature drop across the shell of thickness dx. The thermal conductivity of InP is 70 W/m°K., although the comparative heat flow analysis does not use this value since the analysis and result is independent of the material from which the laser is fabricated.

In the FIG. 3 representation, the heat originates from the heat source (laser 21) and fans out towards the boundaries that are heat sunk. The partial circles represent equidistant points from the source, namely points of equal thermal resistance from the heat source.

Equation (1) states that the best heat sinking occurs when the temperature drop through the material is lowest, and that this occurs if either the area through which the heat is conducting is maximized or if the distance to the heat sink is minimized. To a first approximation, FIG. 3 shows that for a die of the size shown, there is little reason to believe that a gap of less than about 100 μm (2×53 μm) is needed to provide the same level of heat sinking as the epi-up configuration. This is because a half-gap of 53 μm (shown in the diagram for half of a laser) provides as much area to heat sink to, for the same amount of material traversed by the heat, as would be found for an epi-up diebond. This is a conservative estimate since nearly half of the heat sink area in the epi-down bridged bond is closer to the heat source than any of the epi-up heat sink. The actual value for the gap is probably slightly larger, making packaging even easier, Since the ridge device structure is only about 6 μm wide, the 100 μm gap provides a comfortable margin of physical protection for the ridge-waveguide structure.

Epi-down bridged diebonds were prepared by chiseling approximately 200 μm gaps in the gold-tin metallizations of Sumitomo tcBN heat sinks followed by epi-down fluxless die attachment of 1300 nm ridge waveguide lasers. Since these gaps were twice as big as those predicted by the model, measured thermal impedances were expected to be double that of epi-up.

When measured, none of the lasers exhibited the usual shorting problem found for the conventional epi-down geometry, and the thermal impedance was measured to be 1.7 times as great as results found for epi-up geometry, or slightly better than expected. Lasing was well behaved, having a linear light versus current curve with a sharp turn-on threshold voltage. The bonds were mechanically strong and the die were optically clean.

It is most valuable, therefore, to have undamaged epi-down diebonds for ridge waveguide structures, as provided by the present invention, since this structure can be fabricated in devices in higher yields and offers high performance. The epi-down bridged geometry also allows the die to be handled on its backside without the device structure making contact to the vacuum pick-up tool.

The present invention can be used in conjunction with other geometries and techniques for diebonding, such as flip-chip solder passive alignments. It should also work with solders other than AuSn and should contribute to the general reliability of devices by isolating solder materials, which might contribute to long term failure modes, from the laser structure.

Although specific dimensions and materials were recited above to develop an understanding of the present invention, these recitals should not serve as a limitation of the present invention. Rather, it should be apparent to one skilled in the art that any other dimensions, materials, solder patterns, or component configurations may be used by the present invention. For example, any suitable solder material or solder pattern creating the appropriate gaps may be employed.

The diebonding process described herein produces a bridged diebond which prevents hard solder from damaging and stressing soft devices such as InP-based components, while at the same time preserving good heat flow. The bridged diebond consists of an epi-down diebonding geometry, but has intentional solder void(s) or spacing(s) of controlled width at the location of the laser structure(s), thus preventing device contact with the solder. Unlike epi-up geometry, the epi-down geometry of the bridged diebond preserves the registration features for passive alignment applications.

While there has been shown and described herein what are at present considered the preferred embodiments of the invention, it will be obvious to those skilled in the art that various changes and modifications can be made therein without departing from the scope of the invention as defined by the appended claims.

What is claimed is:

1. A method of bonding a laser diode having at least one active region of ridge waveguides to a substrate having a heat sink comprising the steps of:

depositing a patterned layer of AuSn solder on the surface of said substrate corresponding to the at least one active region of the laser diode to be bonded, said patterned layer having at least one gap region on which no AuSn solder is deposited, said at least one gap region corresponding to the position at which said at least one active region of said laser diode will be positioned during diebonding; and epi-down bonding said laser diode to said substrate such that said at least one active region is disposably registered within said at least one gap region without deposited AuSn solder.

2. The method of claim 1 wherein said patterned layer of AuSn solder on the surface of said substrate corresponding to the at least one active region of the laser diode to be bonded includes a plurality of gap regions on which no AuSn solder is deposited, said gap regions corresponding to the positions at which a plurality of active regions of said laser diode will be positioned during diebonding.

* * * * *